(12) United States Patent
Dong et al.

(10) Patent No.: US 6,348,377 B2
(45) Date of Patent: Feb. 19, 2002

(54) METHOD OF MANUFACTURING STORAGE ELECTRODE IN SEMICONDUCTOR DEVICE

(75) Inventors: Cha Deok Dong; Seung Cheol Lee, both of Kyoungki-do; Sang Wook Park, Seoul; Dong Jin Kim, Kyoungki-do, all of (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/867,602

(22) Filed: May 31, 2001

(30) Foreign Application Priority Data

May 31, 2000 (KR) ............................................. 00-29762

(51) Int. Cl.⁷ .......................................... H01L 21/8242
(52) U.S. Cl. ....................................... 438/253; 438/255
(58) Field of Search ........................ 438/238, 240–241, 438/253–256, 381, 393–399

(56) References Cited

U.S. PATENT DOCUMENTS 6,218,258 B1 * 4/2001 Joo ............................ 438/396
6,218,296 B1 * 4/2001 Kwak et al. ................. 438/653

* cited by examiner

Primary Examiner—Jey Tsai

(57) ABSTRACT

A cylindrical storage electrode in a semiconductor device is manufactured by forming a contact hole in a poly oxide film and by forming a first thin film on the film and in the hole. Next, a core oxide film and an anti-reflective coating film are formed on the first thin film to determine the height of the cylinder. A pattern is then formed by etching the anti-reflective coating film, core oxide film and the first thin film such that the poly oxide film is exposed. A second thin film is formed on the overall resultant structure, and a tungsten silicide layer is formed on the second thin film. Inner and outer walls of the cylinder are then formed by blanket-etching the tungsten silicide film and the second thin film such that the core oxide film is exposed. After the core oxide film is removed, a selective metastable polysilicon (SMPS) process is performed so that different grain growths are generated at the inner and outer walls of the cylinder. A storage electrode is then formed by annealing the cylinder. By depositing an amorphous silicon film on the inner wall of the cylinder-type capacitor and Si-rich tungsten silicide film on the outer wall, the surface area of the inner wall expands through normal SMPS and a rugged tungsten silicide film is formed on the outer wall. Spacing between cells is preserved, while generation of a bridge is prevented.

23 Claims, 4 Drawing Sheets

METHOD OF MANUFACTURING STORAGE ELECTRODE IN SEMICONDUCTOR DEVICE

This nonprovisional application incorporates by reference the subject matter of Application No. 2000-29762 filed in Korea on May 31, 2000, on which a priority claim is based under 35 U.S.C. § 119 (a).

BACKGROUND OF THE INVENTION

1. Field of the Invention

The present invention relates to a method of manufacturing a storage electrode in a semiconductor device which can secure spacing between cells and prevent generation of bridges across cells.

2. Description of the Related Art

With a recent increase in the number of memory cells constituting a dynamic random access memory (DRAM) semiconductor device, the area occupied by each memory cell has gradually decreased. Meanwhile, a capacitor formed in each of the memory cells needs a sufficient capacitance for accurate reading of stored data. Accordingly, the current DRAM semiconductor device requires a memory cell with a capacitor having a large capacitance but which occupies a small area.

In a memory device having a capacity over 256M-bits, an inner cylinder type storage electrode is adopted to enhance the capacitance of a capacitor. FIGS. 1A through 1C are sectional views for explaining a conventional method of manufacturing an inner cylinder type storage electrode.

Referring to FIG. 1A, a first insulation film 11 is formed on a semiconductor substrate 10. The first insulation film 11 is etched such that the substrate 10 is partially exposed, thus forming a contact hole for a capacitor. A conductive film 12 for a storage electrode is formed on the surface of the contact hole and the upper surface of the first insulation film 11. Next, a second insulation film 13 is formed on the conductive film 12 so that the contact hole where the conductive film 12 is formed may be embedded. As shown in FIG. 1B, the surfaces of the second insulation film 13 and the conductive film 12 are sequentially etched such that the surface of the first insulation film 11 is exposed. Thus, the conductive film 12 is separated so inner cylinder type electrodes 12A and 12B for a storage electrode are formed.

Then, as shown in FIG. 1C, portions of the first and second insulation films 11 and 13 are removed by wet etching. By adjusting an etch selection ratio of the first and second insulation films 11 and 13, the etching is performed such that the first insulation film 11 outside the cylinder can remain at a predetermined height.

The above conventional method of manufacturing enlarges the surface area by growing the inner and outer walls of the cylinder by using a selective metastable polysilicon (SMPS) process with an undoped amorphous silicon thin film or a low-concentration doped amorphous silicon (a-Si) thin film. However, the design rule is decreased, and during such SMPS growing the thickness of the outer wall of the cylinder increases by 250–400 Å. Thus, a sufficient process margin is not secured and a bridge is generated between the capacitors due to destroyed grains. Due to the above problems, conversion of the storage electrode into an inner cylinder or a crown cylinder has necessitated many process changes, and have made of device development more difficult.

SUMMARY OF THE INVENTION

Accordingly, the present invention is directed to a method of manufacturing a storage electrode in a semiconductor device that substantially obviates one or more of the problems due to limitations and disadvantages of the related art.

In accordance with the purpose of the invention, as embodied and broadly described, in one aspect the invention includes a method of manufacturing a storage electrode in a semiconductor device including forming a contact for a storage electrode in a poly oxide film formed on the semiconductor device and forming a first thin film thereon; forming a core oxide film and an anti-reflective coating film on the first thin film; forming a pattern by etching the anti-reflective coating film, core oxide film and the first thin film so that the poly oxide film is exposed; forming a second thin film on the overall resultant structure; forming a tungsten silicide layer on the second thin film; forming inner and outer walls of the storage electrode by blanket-etching the tungsten silicide film and the second thin film; removing the anti-reflective coating film and the core oxide film; performing a selective metastable polysilicon (SMPS) process so that different grain growths are generated at the inner and outer walls of the storage electrode; and forming a storage electrode by performing an annealing process in the storage electrode.

In another aspect, the invention includes a method of manufacturing storage electrodes including removing portions of an oxide film on a semiconductor device; forming a first thin film on the oxide film and the semiconductor device; depositing at least one layer over the first thin film; etching the at least one layer and the first thin film to define a pattern of structures; forming a second thin film on the pattern of structures; forming a tungsten silicide layer on the second thin film; forming inner and outer walls of the storage electrodes by etching away the tungsten silicide film and the second thin film over the pattern of structures; performing a selective metastable polysilicon (SMPS) process so that different grain growths are generated at the inner and outer walls of the storage electrodes; and annealing the first thin film.

In yet another aspect, the invention includes a storage electrode in a semiconductor device, including an oxide layer having a contact hole therein; a first thin film layer formed in the contact hole; an outer wall extending upward from the oxide layer and including tungsten silicide; and an inner wall adjacent to the outer wall and contacting the first thin film layer and including a second thin film, wherein the inner wall has an amount of grain growth, and the outer wall has a smaller amount of grain growth than the inner wall.

The present invention advantageously provides a method of manufacturing a storage electrode in a semiconductor device which can secure spacing between cells and prevent generation of a bridge by depositing amorphous silicon (a-Si) film on the inner wall of a cylindrical capacitor and tungsten silicide (WSix) film rich in silicon (Si), and performing a selective metastable polysilicon (SMPS) process to enlarge the surface area of the inner wall through a normal SMPS growing and form an uneven tungsten silicide film on the outer wall.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one embodiment of the invention and together with the description serve to explain the principles of the invention.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 1A:
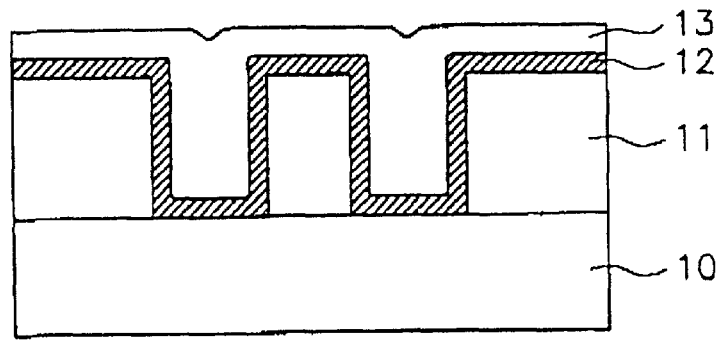
FIGS. 1A through 1C are sectional views for explaining the conventional method of manufacturing an inner cylinder type storage electrode.
Figure 1B:
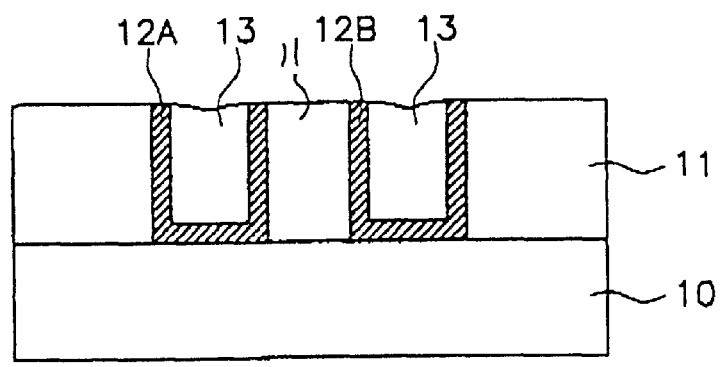

In the following description, the same elements having the same functions throughout the drawings use the same reference numerals, and repeated descriptions thereof will be omitted.

Referring to FIGS. 2A through 2G, in a method of manufacturing a storage electrode in a semiconductor device according to the present invention, word lines and bit lines (not shown) are formed, and an inter poly oxide (IPO) film 21 for insulation between poly layers is deposited. A poly-3 contact hole is formed in the IPO film 21 (see FIG. 2A). A doped amorphous silicon thin film and an undoped amorphous silicon thin film are deposited on the structure where the poly-3 contact hole is formed at a temperature under 550° C. to completely fill the poly-3 contact hole, so that a poly-3A thin film 22 is formed on a silicon inner wall. Here, the undoped amorphous silicon thin film is formed at the bottom of a cylinder inner wall to be thin enough to allow grain growth by a selective metastable polysilicon (SMPS) process.

The doped amorphous silicon thin film formed on the undoped amorphous silicon thin film is deposited by a low pressure chemical vapor deposition (LP-CVD) method using source gases such as phosphine ($PH_3$), silane ($SiH_4$) or $Si_2H_6$.

The growth of the undoped amorphous silicon thin film continues in-situ while a phosphine ($PH_3$) valve is closed after the doped amorphous silicon thin film is deposited. Here, the rate of the undoped amorphous silicon thin film should be maintained at 10–30% of an entire thickness of the poly-3A thin film 22.

Figure 2A:
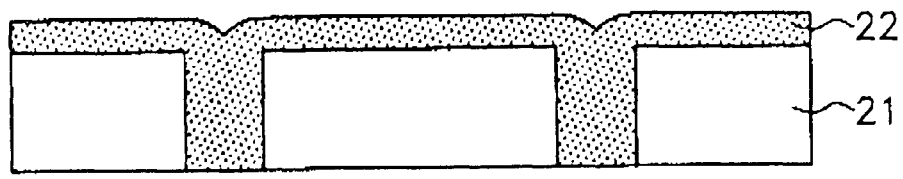
FIGS. 2A through 2G are sectional views for explaining a method of manufacturing a storage electrode according to a preferred embodiment of the present invention.
Figure 2B:
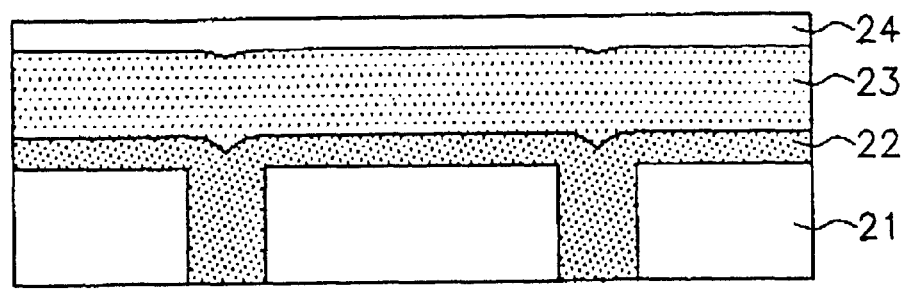

Then, as shown in FIG. 2B, a core oxide film 23 for setting the height of a later-formed cylinder structure is deposited on the poly-3A thin film 22 at a thickness of 6000 Å or more. An anti-reflective coating (ARC) film 24 for a poly-3 mask is deposited on the core oxide film 23.

Figure 2C:
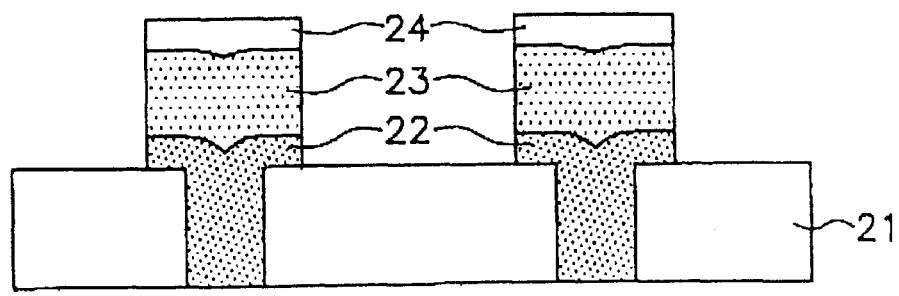

After the core oxide film 23 and the ARC film 24 are formed, the ARC film 24, the core oxide film 23 and the poly-3A thin film 22 are sequentially etched such that the IPO film is exposed, as shown in FIG. 2C. Thus, a pattern for manufacturing a cylinder-type capacitor is formed.

Figure 2D:
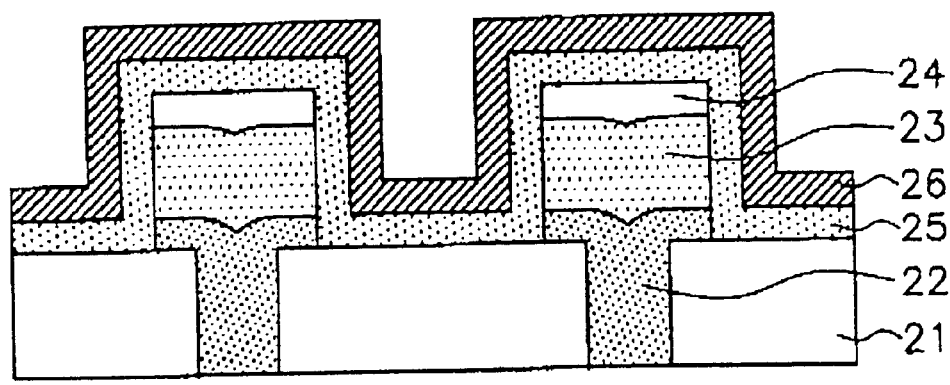

After the poly-3A thin film 22 is masked and etched, a poly-3B thin film 25 to be used as an inner wall of the cylinder later is deposited to a thickness of 200Å or more by an P-CVD method by using the undoped amorphous silicon film or thinly doped amorphous silicon thin film, as shown in FIG. 2D. Then, a tungsten silicide (WSix) thin film 26 which is rich in silicon is deposited on the poly-3B thin film 25 to a thickness of 200 Å or more. Here, the WSix thin film 26 has a stoichiometry of $x \geq 3.5$.

The poly-3B thin film 25 and the WSix thin film 26 can be deposited by using a tungsten silicide chamber in-situ. When other CVD equipment is used, a natural oxide film is removed through a pretreatment cleaning process using hydrogen fluoride (HF) or buffer oxide etchant (BOE) before the WSix film 26 is deposited.

Figure 2E:
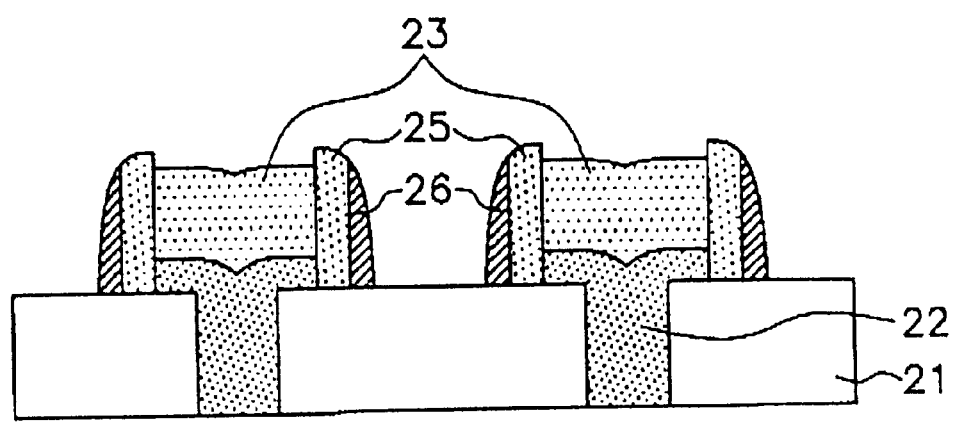

After the poly-3B thin film 25 and the Si-rich WSix film 26 are deposited, the poly-3B thin film 25 and the Si-rich WSix film 26 are blanket-etched until the core oxide film 23 is exposed so that the inner wall 25 and outer wall 26 of the cylinder are formed, as shown in FIG. 2E. In order to completely remove WSix film 26 or Si thin film 25, which can generate leakage current between the cylinders, an over-etch is performed so that the ARC film 24 is removed and the IPO film 21 is also removed to some extent.

Figure 2F:
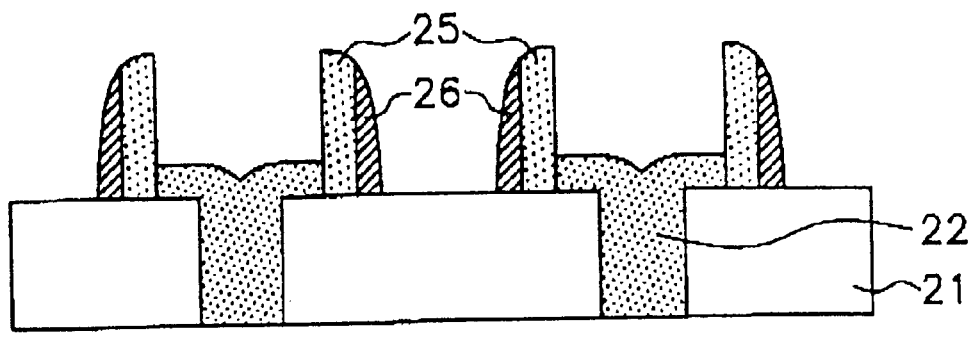

Then, as shown in FIG. 2F, the core oxide film 23 is etched to remove an oxide film remaining on the surface of the poly-3B thin film 25 or WSix film 26. Then, a pretreatment cleaning process using HF is performed.

Figure 2G:
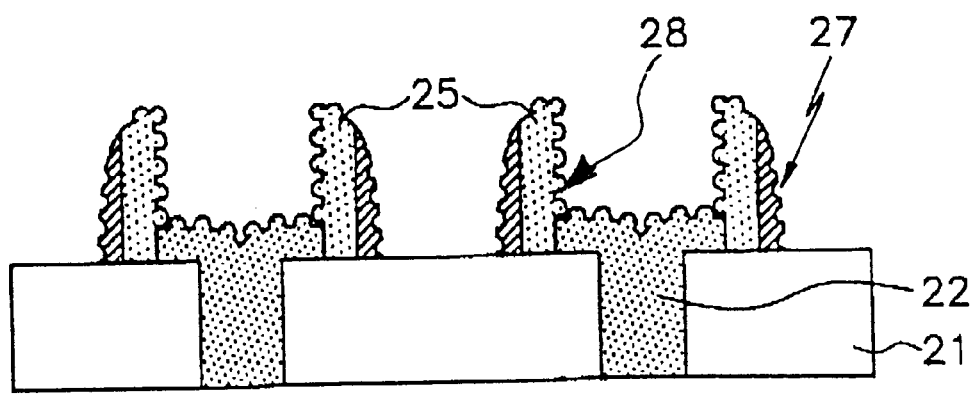

Next, an SMPS process using movement of silicon atoms is performed, and grain growth of a normal SMPS film 28 occurs on the inner wall of the cylinder as shown in FIG. 2G. Also, a rugged WSix film 27 is formed on the outer wall, but does not increase the outer wall's thickness much.

Thereafter, a post plasma phosphine ($PF_3$) annealing process is performed to provide conductivity to the inside of the cylinder where the undoped silicon thin film 22 is deposited, so that a semiconductor storage electrode is completed.

Figure 1C:
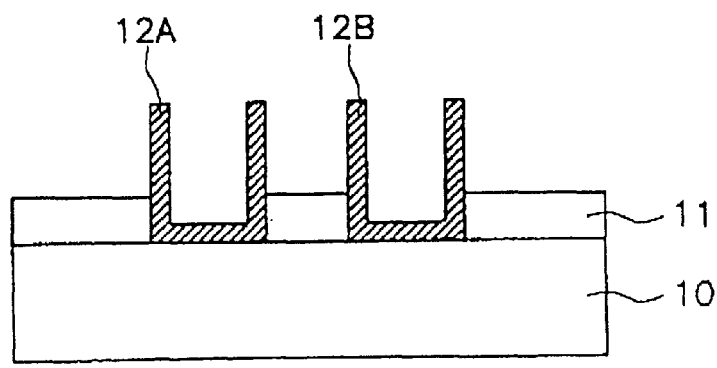

When the SMPS process is applied to the conventional cylinder type capacitor, the thickness of the outer wall of the cylinder increases by 50–400 Å during the SMPS process (FIG. 1C, not shown). With the increase in the thickness, space between the cylinders becomes narrow due to growth of grains or a failure due to a bridge of destroyed grains is generated. Thus, as the semiconductor device is highly integrated and the design rule is reduced, a sufficient space between the cylinder capacitors cannot be obtained. Hence, to increase the area of the capacitor by using the SMPS process, a selective grain growth of the inner and outer walls of the cylinder is needed.

Therefore, in the method of manufacturing storage electrode in a semiconductor device according to the present invention, Si-rich WSix ($x \geq 3.5$) is deposited on the outer wall of the cylinder, and the SMPS process is performed after the conventional poly-3B thin film is deposited on the inner wall. Thus, normal grain growth is performed on the inner wall of the cylinder while the rugged WSix film different from the grain growth is formed on the outer wall. In such a thin film, the increase in the thickness of the outer wall of the cylinder by the SMPS process is less ($\leq 200$ Å) and grain is hardly destroyed.

Also, the post plasma phosphine ($PF_3$) annealing process performed after the SMPS process can be skipped, and the process time can be reduced. In the case of the Si-rich WSix film, because poor step coverage by the conventional WSix film ($1.8 \leq x \leq 2.5$) can be compensated for, effective deposition is possible so that the manufacturing of storage electrodes may be smoothly performed. In the storage electrode in a semiconductor device manufactured as above, poly-3 bridging between capacitors is reduced and yield is improved. Also, existing equipment may still be used in the manufacturing process without additional equipment. Further, confusion in a change of process due to a capacitor having a new structure may be avoided and a storage electrode (poly-3) having superior film quality is obtained.

It is noted that the present invention is not limited to the preferred embodiment described above, and it is apparent that variations and modifications by those skilled in the art can be effected within the spirit and scope of the present invention defined in the appended claims.

What is claimed is:

1. A method of manufacturing a storage electrode in a semiconductor device comprising:

forming a contact for a storage electrode in a poly oxide film formed on the semiconductor device and forming a first thin film thereon;

forming a core oxide film and an anti-reflective coating film on the first thin film;

forming a pattern by etching the anti-reflective coating film, core oxide film and the first thin film so that the poly oxide film is exposed;

forming a second thin film on the overall resultant structure;

forming a tungsten silicide layer on the second thin film;

forming inner and outer walls of the storage electrode by blanket-etching the tungsten silicide film and the second thin film;

removing the anti-reflective coating film and the core oxide film;

performing a selective metastable polysilicon (SMPS) process so that different grain growths are generated at the inner and outer walls of the storage electrode; and forming a storage electrode by performing an annealing process in the storage electrode.

2. The method as claimed in claim 1, wherein the first thin film layer has a dual structure of a doped amorphous silicon thin film and an undoped amorphous silicon thin film.

3. The method as claimed in claim 2, wherein the undoped amorphous silicon thin film is formed at a bottom of the inner wall of the storage electrode so as to have a thickness that is 10–30% of an entire thickness of the first thin film layer.

4. The method as claimed in claim 3, wherein the undoped amorphous silicon thin film is deposited by using a source gas of $SiH_2Cl_2$ at a temperature between 480–550° C.

5. The method as claimed in claim 2, wherein the doped amorphous silicon thin film is formed on the undoped amorphous silicon thin film by a low pressure chemical vapor deposition (LPCVD) method.

6. The method as claimed in claim 5, wherein the doped amorphous silicon thin film is formed by using silicon source gas such as silane ($SiH_4$) or $Si_2H_6$ and phosphine (PH) source gas.

7. The method as claimed in claim 1, wherein the second thin film layer is an undoped amorphous silicon thin film.

8. The method as claimed in claim 1, wherein the second thin film layer is a doped amorphous silicon thin film.

9. The method as claimed in claim 8, wherein the doped amorphous silicon thin film is formed by using silicon source gas such as silane ($SiH_4$) or $Si_2H_6$ and phosphine (PH) source gas.

10. The method as claimed in claim 1, wherein the second thin film layer is formed by forming an amorphous silicon thin film to have a thickness of 200 Å or more where grain growth is facilitated in an atmosphere of a low pressure about 0.2–1 torr.

11. The method as claimed in claim 10, wherein the amorphous silicon film is formed by a low pressure chemical vapor deposition (LPCVD) method.

12. The method as claimed in claim 10, wherein the amorphous silicon film is deposited in-situ.

13. The method as claimed in claim 10, wherein a natural oxide film is removed by performing a pretreatment cleaning process using hydrogen fluoride (HF) or buffer oxide etchant (BOE) after the amorphous silicon film is deposited.

14. The method as claimed in claim 1, wherein the tungsten silicide film grows by using reaction between $SiH_2Cl_2$ and $WF_6$.

15. The method as claimed in claim 1, wherein the tungsten silicide film is deposited at a temperature between 300–500° C.

16. The method as claimed in claim 1, wherein the tungsten silicide layer is deposited to have a thickness of 200 Å or more by using material having stoichiometry ($x \geq 3.5$) and containing a large amount of silicon.

17. The method as claimed in claim 1, wherein the a natural oxide film is removed by performing an SMPS pretreatment cleaning process using hydrogen fluoride after the anti-reflective coating film and the core oxide film are removed.

18. The method as claimed in claim 1, wherein the annealing process is a post plasma phosphine annealing process.

19. A method of manufacturing storage electrodes comprising:

removing portions of an oxide film on a semiconductor device;

forming a first thin film on the oxide film and the semiconductor device;

depositing at least one layer over the first thin film;

etching the at least one layer and the first thin film to define a pattern of structures;

forming a second thin film on the pattern of structures;

forming a tungsten silicide layer on the second thin film;

forming inner and outer walls of the storage electrodes by etching away the tungsten silicide film and the second thin film over the pattern of structures;

performing a selective metastable polysilicon (SMPS) process so that different grain growths are generated at the inner and outer walls of the storage electrodes; and annealing the first thin film.

20. The method as claimed in claim 19, wherein the second thin film layer is formed by forming an amorphous silicon thin film to have a thickness of 200 Å or more.

21. The method as claimed in claim 19, wherein the tungsten silicide layer is deposited to have a thickness of 200 Å or more by using material having stoichiometry ($x \geq 3.5$) and containing a large amount of silicon.

22. The method as claimed in claim 19, wherein an increase in a thickness of the outer walls is 200 Å or less.

23. The method as claimed in claim 22, the outer walls are formed of tungsten silicide.

* * * * *